US010243143B2

(12) United States Patent
Frank et al.

(10) Patent No.: US 10,243,143 B2
(45) Date of Patent: Mar. 26, 2019

(54) HETEROGENEOUS NANOSTRUCTURES FOR HIERARCHAL ASSEMBLY

(71) Applicant: International Business Machines Corporation, Armonk, NY (US)

(72) Inventors: Martin M. Frank, Dobbs Ferry, NY (US); Shu-Jen Han, Cortlandt Manor, NY (US); George S. Tulevski, Croton-on-Hudson, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/699,527

(22) Filed: Sep. 8, 2017

(65) Prior Publication Data

US 2018/0013070 A1    Jan. 11, 2018

Related U.S. Application Data

(62) Division of application No. 15/092,894, filed on Apr. 7, 2016, now Pat. No. 9,806,265.

(51) Int. Cl.
*H01L 51/00* (2006.01)
*H01L 51/05* (2006.01)
*H01L 51/10* (2006.01)

(52) U.S. Cl.
CPC ...... *H01L 51/0049* (2013.01); *H01L 51/0048* (2013.01); *H01L 51/102* (2013.01); *H01L 51/0575* (2013.01); *H01L 2251/301* (2013.01); *H01L 2251/303* (2013.01); *Y10S 977/938* (2013.01)

(58) Field of Classification Search
CPC ................... H01L 2251/301; Y10S 977/938
See application file for complete search history.

(56) References Cited

U.S. PATENT DOCUMENTS

2005/0212014 A1*    9/2005    Horibe .................. B82Y 10/00
                                                              257/213

OTHER PUBLICATIONS

List of IBM Patents or Patent Applications Treated as Related; (Appendix P), Filed Sep. 12, 2017; 2 pages.
Martin M. Frank, et al., "Heterogenous Nanostructures for Hierarchal Assembly", U.S. Appl. No. 15/092,894, filed Apr. 7, 2016.

* cited by examiner

*Primary Examiner* — Moazzam Hossain
*Assistant Examiner* — Farun Lu
(74) *Attorney, Agent, or Firm* — Cantor Colburn LLP; Vazken Alexanian

(57) ABSTRACT

A method of making a carbon nanotube structure includes depositing a first oxide layer on a substrate and a second oxide layer on the first oxide layer; etching a trench through the second oxide layer; removing end portions of the first oxide layer and portions of the substrate beneath the end portions to form cavities in the substrate; depositing a metal in the cavities to form first body metal pads; disposing a carbon nanotube on the first body metal pads and the first oxide layer such that ends of the carbon nanotube contact each of the first body metal layers; depositing a metal to form second body metal pads on the first body metal pads at the ends of the carbon nanotube; and etching to release the carbon nanotube, first body metal pads, and second body metal pads from the substrate, first oxide layer, and second oxide layer.

7 Claims, 9 Drawing Sheets

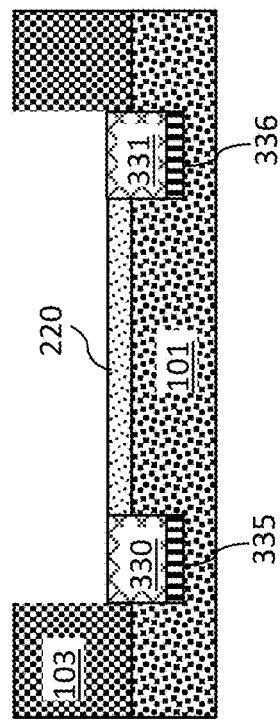
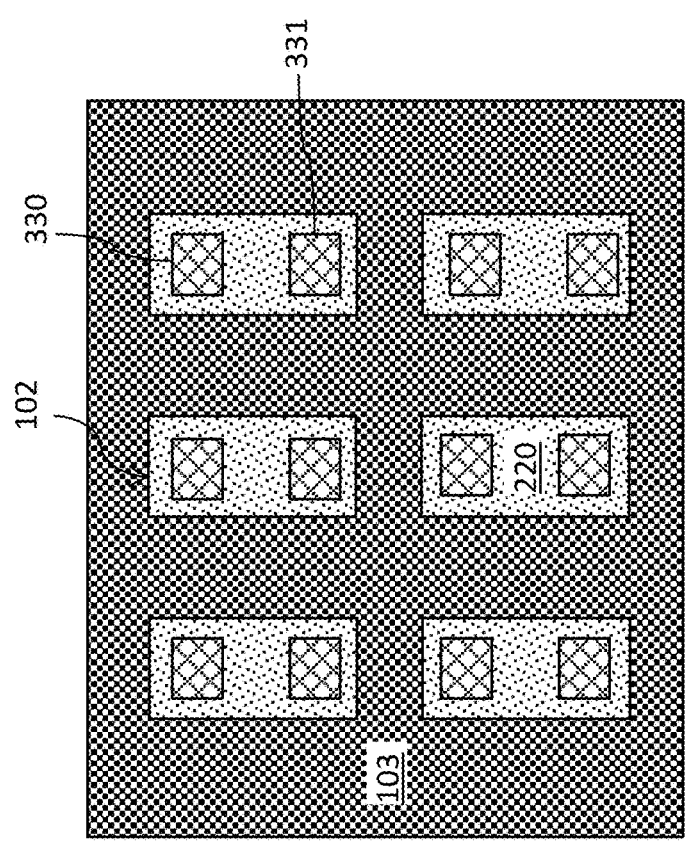
FIG. 3B
FIG. 3A

HETEROGENEOUS NANOSTRUCTURES FOR HIERARCHAL ASSEMBLY

PRIORITY

This application is a division of and claims priority from U.S. patent application Ser. No. 15/092,894, filed on Apr. 7, 2016, entitled "HETEROGENEOUS NANOSTRUCTURES FOR HIERARCHAL ASSEMBLY," the entire contents of which are incorporated herein by reference.

BACKGROUND

The present invention relates to nanotechnology, and more specifically, to carbon nanotube structures.

Nanomaterials are materials that have nanoscale dimensions. Individual repeating units of nanomaterials may be between 1 and 1,000 nanometers (nm) ($10^{-9}$ meter), or between 1 and 100 nm, in at least one dimension. Nanomaterials may be natural, synthetic, or semi-synthetic. One example of natural functional nanomaterials in biological systems includes the protein capsids of viruses. Natural inorganic nanomaterials can occur through crystal growth in the diverse chemical conditions of the earth's crust.

Carbon-containing tubes or spheres can be used to form synthetic nanomaterials. The fullerenes are a class of allotropes of carbon that form sheets of graphene that are rolled into tubes or spheres. These carbon nanotubes have favorable electrical properties and mechanical strength.

Various synthetic nanomaterials have unique optical, electronic, and mechanical properties. Because of the unique properties of nanoscale materials, the emergence of a variety of nanoscale materials has generated enormous interest from the research community over the last 20 years.

SUMMARY

According to an embodiment, a method of making a carbon nanotube structure includes depositing a first oxide layer on a substrate, and depositing a second oxide layer on the first oxide layer; etching a trench through the second oxide layer to expose the first oxide layer; removing end portions of the first oxide layer and corresponding portions of the substrate beneath the end portions of the first oxide layer to form cavities in the substrate; depositing a metal in the cavities in the substrate to form first body metal pads that are embedded in the substrate; disposing a carbon nanotube on the first body metal pads and the first oxide layer such that ends of the carbon nanotube contact each of the first body metal layers; depositing a metal to form second body metal pads on the first body metal pads at the ends of the carbon nanotube; and etching to release the carbon nanotube, first body metal pads, and second body metal pads from the substrate, first oxide layer, and second oxide layer.

According to another embodiment, a carbon nanotube nanostructure includes a carbon nanotube having a first end and a second end; a first body metal pad arranged on the first end of the carbon nanotube, the first body metal pad having a first face metal layer arranged on a first surface of the first body metal pad, and a second face metal layer arranged on a second opposing surface of the first body metal pad; a second body metal pad arranged on the second end of the carbon nanotube, the second body metal pad having a first face metal layer arranged on a first surface of the second body metal pad, and a second face metal layer arranged on a second opposing surface of the second body metal pad; and a chemical compound including a functional group bonded to the first face metal layer of the first body metal pad.

Yet, according to another embodiment, a carbon nanotube nanostructure includes a first carbon nanotube structure, including: a carbon nanotube having a first end and a second end; a first body metal pad arranged on the first end, the first body metal pad having face metal layers arranged on two opposing surfaces of the first body metal pad; and a second body metal pad arranged on the second end, the second body metal pad having face metal layers arranged on two opposing surfaces of the second body metal pad; and a second carbon nanotube structure, including: a carbon nanotube having a first end and a second end; a first body metal pad arranged on the first end, the first body metal pad having face metal layers arranged on two opposing surfaces of the first body metal pad; and a second body metal pad arranged on the second end, the second body metal pad having face metal layers arranged on two opposing surfaces of the second body metal pad; wherein a sidewall of the first body metal pad of the first carbon nanotube structure is functionalized with a chemical compound that bonds to the second carbon nanotube structure, and the first carbon nanotube structure and the second nanotube structure are arranged end-to-end.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 1A-9 illustrate exemplary methods of making nanostructures according to various embodiments, in which:

FIGS. 1A and 1B are a top view and a cross-sectional side view, respectively, of a first oxide layer and a second oxide layer arranged on a substrate;

FIGS. 3A and 3B are a top view and a cross-sectional side view, respectively, after removing portions of the first oxide layer and depositing face metal layers and body metal layers;

FIG. 7 is a cross-sectional side view of a carbon nanotube dumbbell structure formed after removing the surrounding oxide layers and substrate;

FIG. 8 is a cross-sectional side view of an assembled two-face functionalized array of carbon nanotube dumbbell structures; and FIG. 9 is a cross-sectional side view of an assembled all-face functionalized array of carbon nanotube dumbbell structures.

DETAILED DESCRIPTION

As mentioned above, nanoscale materials possess optical and electronic properties that may be exploited in various technological applications. However, despite advantageous properties and considerable research efforts, many nanoscale materials have not been integrated into technological applications. One challenge that may prevent implementation of nanoscale materials is a lack of assembly methods and tools to produce larger scale, functional systems and components.

Accordingly, described herein are methods for high-throughput production of carbon nanotube structures that are end- and/or surface-functionalized with highly tailorable metals. The resulting carbon nanotube repeating units (unit cells), or "dumbbell-like" carbon nanotube structures (see, for example, FIG. 7), are used as feedstock for hierarchal assembly into three-dimensional structures (see, for example, FIGS. 8 and 9). The three-dimensional structures can be tailored for a wide variety of electrical and optical properties.

Figure 1B:
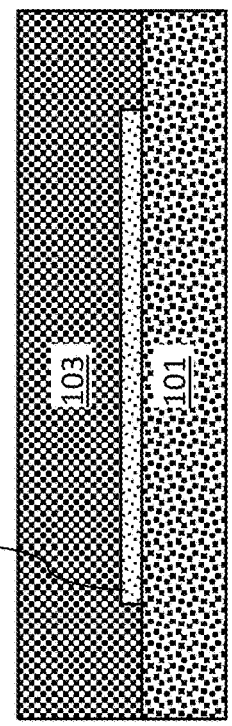
Figure 1A:
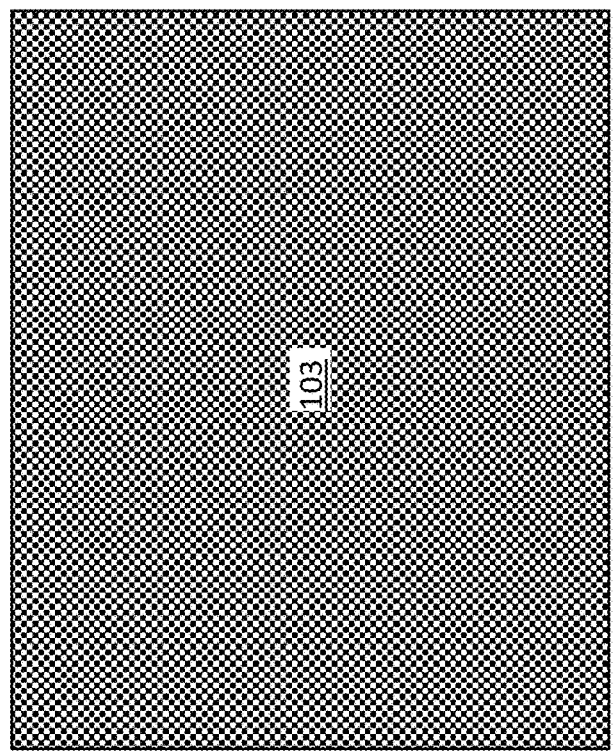

Turning now to the Figures, FIGS. 1A-9 illustrate exemplary methods of making nanostructures according to various embodiments. FIGS. 1A and 1B are a top view and a cross-sectional side view, respectively, of a first oxide layer 220 and a second oxide layer 103 arranged on a substrate 101. The first oxide layer 220 is deposited on the substrate 101, and the second oxide layer 103 is deposited on the first oxide layer 220.

The substrate 101 may include one or more semiconductor materials and/or insulator materials. Non-limiting examples of suitable substrate 101 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other examples of suitable substrates include silicon-on-insulator (SOI) substrates and silicon-germanium-on-insulator (SGOI) substrates with buried oxide (BOX) layers. In one embodiment, the substrate 101 includes silicon dioxide, and the first oxide layer 220 is deposited on the silicon dioxide.

The first oxide layer 220 may include a metal oxide material. Examples of metal oxides for the first oxide layer 220 include, but are not limited to, hafnium oxide, aluminum oxide, titanium oxide, zinc oxide, or a combination thereof. The thickness of the first oxide layer 220 may generally vary. In some embodiments, the first oxide layer 220 has a thickness of about 1 to about 50 nm, or about 2 to about 10 nm.

The second oxide layer 103 may be an insulating non-metal oxide material. Examples of insulating non-metal oxides include, but are not limited to, silicon dioxide, germanium dioxide, gallium oxide, arsenic oxide, or any combination thereof. The thickness of the second oxide layer 103 may generally vary. In some embodiments, the second oxide layer 103 has a thickness of about 1 to about 100 nm, or about 10 to about 20 nm.

In some embodiments, first oxide layer 220 and second oxide layer 103 have different isoelectric points. An isoelectric point is the pH at which a surface carries no net electric charge. The first oxide layer 220 has a first isoelectric point, and the second oxide layer 103 has a second isoelectric point. The first and second isoelectric points are different from each other, with the first isoelectric point (i.e., isoelectric point of the first oxide layer 220) being greater than the second isoelectric point in some embodiments (i.e., isoelectric point of the second oxide layer 103). The difference of the isoelectric points of the first oxide layer 220 and the second oxide layer 103 is at least four in other embodiments. For example, a first oxide layer 220 of hafnium oxide with an isoelectric point around 7 and a second oxide layer 103 of silicon dioxide with an isoelectric point around 2 results in a difference in the isoelectric points of about 5. This difference in isoelectric points aids in selective assembly of the carbon nanotubes (see FIGS. 4A and 4B described below).

Figure 2B:
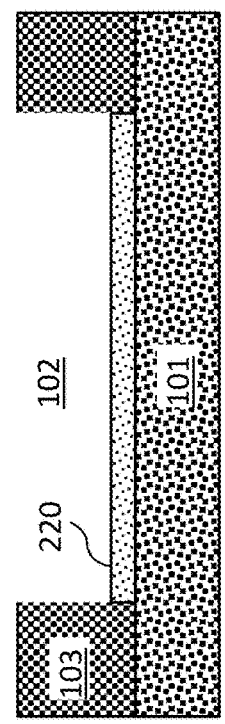
FIGS. 2A and 2B are a top view and a cross-sectional side view, respectively, after forming trenches on the substrate to expose the first oxide layer.
Figure 2A:
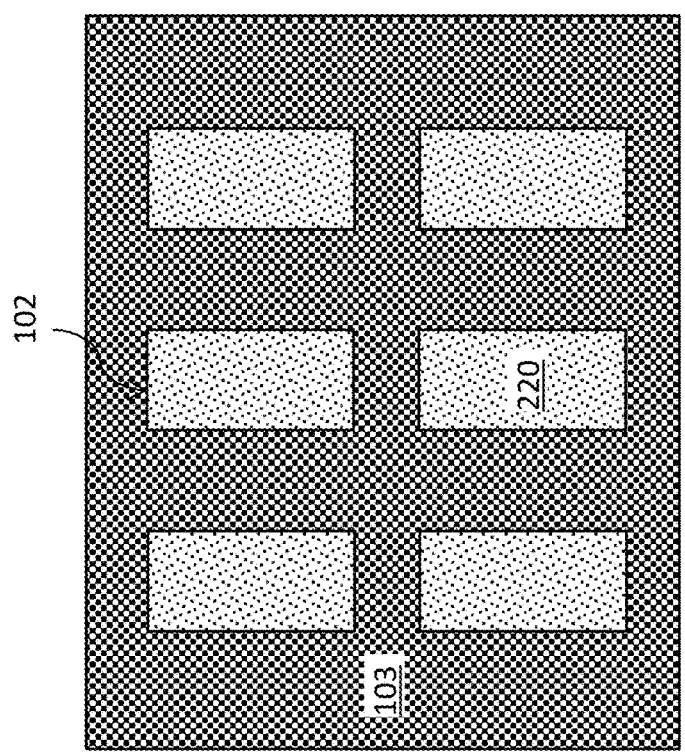

FIGS. 2A and 2B are a top view and a cross-sectional side view, respectively, after forming trenches 102 on the substrate 101 to expose the first oxide layer 220. One or more trenches 102 may be formed on the substrate 101 by lithography and etching, removing a portion of the second oxide layer 103. The trenches 102 extend from a surface of the second oxide layer 103 to the first oxide layer 220.

FIGS. 3A and 3B are a top view and a cross-sectional side view, respectively, after removing portions of the first oxide layer 220 and depositing face metal layers 335, 336 and body metal layers 330, 331. Lateral end portions (first and second end portions) of the first oxide layer 220 are removed by, for example, etching. Corresponding portions of the substrate 101 beneath the removed lateral end portions of the first oxide layer 220 are also removed to form cavities in the substrate 101 beneath the first oxide layer 220. Face metal layers 335, 336 (first and second face metal layers) are then deposited in the cavities formed within the substrate 101, beneath the first oxide layer 220. Body metal layers 330, 331 (first and second body metal layers) are deposited on the face metal layers 335, 336. The body metal layers 330, 331 form first body metal pads embedded within the substrate 101. In some embodiments, body metal layers 330, 331 are deposited directly into the cavities in the substrate 101 without depositing face metal layers 335, 336. After depositing the face metal layers 335, 336 and body metal layers 330, 331, planarization processes may be performed to remove excess metals from surfaces of the first oxide layer 220 and second oxide layer 103. Face metal layers 335, 336 and body metal layers 330, 331 are embedded in the substrate 101.

Face metal layers 335, 336 may be the same or different. Non-limiting examples of metals for face metal layers 335, 336 include aluminum (Al), platinum (Pt), gold (Au), tungsten (W), titanium (Ti), palladium (Pd), or any combination thereof. Face metal layers 335, 336 may be deposited by a suitable deposition process, for example, chemical vapor deposition (CVD), plasma enhanced chemical vapor deposition (PECVD), physical vapor deposition (PVD), plating, thermal or e-beam evaporation, sputtering, or other like processes. The thickness of face metal layers 335, 336 may generally vary. In some embodiments, face metal layers 336, 336 have a thickness in a range from about 0.5 to about 10 nm, or from about 0.5 to about 2 nm.

Body metal layers 330, 331 may be the same or different. In embodiments shown, body metal layers 330, 331 are thicker than face metal layers 335, 336. In other embodiments, body metal layers 330, 331 have substantially the same thickness as face metal layers 335, 336. Non-limiting examples of metals for body metal layers 330, 331 include aluminum (Al), platinum (Pt), gold (Au), tungsten (W), titanium (Ti), or any combination thereof. Body metal layers 330, 331 may be deposited by a suitable deposition process, for example, CVD, PECVD, PVD, plating, thermal or e-beam evaporation, sputtering, or other like processes. The thickness of body metal layers 330, 331 may generally vary. In some embodiments, body metal layers 330, 331 have a thickness in a range from about 0.5 to about 10 nm, or from about 0.5 to about 2 nm.

Figure 4B:
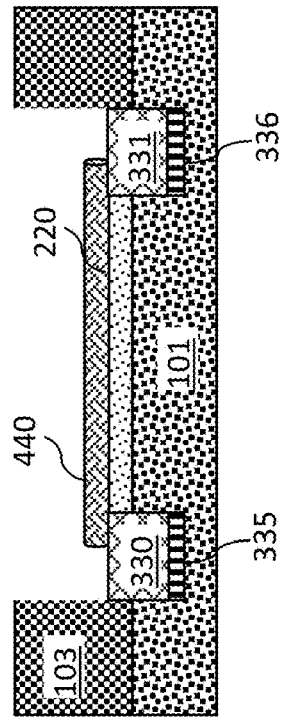
FIGS. 4A and 4B are a top view and a cross-sectional side view, respectively, after selectively bonding a carbon nanotube to the body metal layers.
Figure 4A:
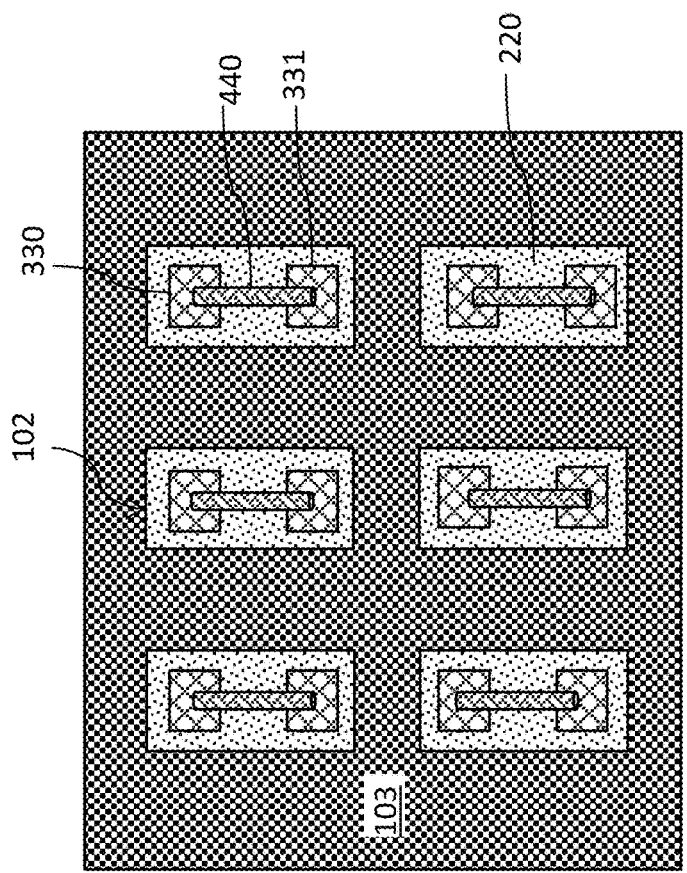

FIGS. 4A and 4B are a top view and a cross-sectional side view, respectively, after selectively bonding a carbon nanotube 440 to the body metal layers 330, 331 and/or the first oxide layer 220. The carbon nanotube 440 may be selectively bonded to body metal layers 330, 331 and/or the first oxide layer 220 using suitable chemical intermediate compounds and functionalized compounds. Although exemplary methods of selectively arranging the carbon nanotube 440 on the substrate 101 such that ends of the carbon nanotube 440 contact the body metal layers 330, 331 and the central body region of the carbon nanotube 440 extends over the first oxide layer 220, any methods and/or chemistry may be employed.

In one exemplary embodiment, the carbon nanotube 440 may be anchored to the body metal layers 330, 331 and/or the first oxide layer 220 with a bifunctional chemical compound. The bifunctional chemical compound can selectively bond to (interact with) (1) the first oxide layer 220 and/or body metal layers 330, 331, and (2) the carbon nanotube 440. The chemical compound may have a first functional group that selectively bonds to body metal layers 330, 331 and/or first oxide layer 220 (and not the second oxide layer 103) and a second functional group that selectively bonds to carbon nanotube 440. The first functional group anchors the chemical compound to the body metal layers 330, 331 and/or the first oxide layer 220, and the second functional anchors the carbon nanotube 440 to the body metal layers 330, 331.

When used, a solution including the bifunctional chemical compound may be disposed on the substrate 101 to form a bond between the first functional group of the chemical compound (the anchoring functional group) and either or both of the body metal layers 330, 331 and first metal layer 220, forming a self-assembled monolayer. After bonding the first functional group of the chemical compound to the body metal layers 330, 331 and/or the first oxide layer 220, the second functional group extends from the self-assembled monolayer. The second functional group may include an ionic charged moiety (first ionic charged moiety). The ionic charged moiety may be in the form of a salt.

Following formation of the self-assembled monolayer, the carbon nanotubes 440 are disposed on the substrate 101. The carbon nanotubes 440 may include another ionic charged moiety (second ionic charged moiety) that is opposite to the ionic charged moiety (first ionic charged moiety) extending from the self-assembled monolayer. When the first and second ionic charge moieties are oppositely charged, the carbon nanotubes 440 are electrostatically attracted to the self-assembled monolayer to bond the carbon nanotubes 440 to the self-assembled monolayer.

When a bifunctional molecule is used, the identity of the first functional group (the anchoring group) depends upon the material of the first oxide layer 220 and the body metal layers 550, 551. Non-limiting examples of first functional groups for bonding to the first oxide layer 220 and/or body metal layers 550, 551 include thiol groups (—SH), isontrile (—NC) groups, phosphonic acid groups, (—PO$_3$H$_2$), or hydroxamic acid groups (—CONHOH). Similarly, the identity of the second functional group (group that extends from the carbon nanotube 440) depends upon the carbon nanotube 440. The second functional group may be a positively charged group (for example, an ammonium salt, a pyridinium salt, a sulfonium salt, or a phosphonium salt) or a negatively charged group (for example, a carboxylate group).

In one exemplary embodiment, the bifunctional molecule includes a hydroxamic acid group that bonds to the first oxide layer 220 and a methylpyridinium salt as the first functional group. The carbon nanotubes are deposited as a dispersion and surrounded by a sulfate-containing surfactant. The negatively charged ion of the methylpyridinium salt (for example, iodide) is exchanged for the negatively charged sulfate group surrounding the carbon nanotube to result in selective binding of the carbon nanotubes to the first oxide layer 220.

The carbon nanotubes 440 may be functionalized to include any ionic charge moiety. The carbon nanotube 440 may include a positively charged moiety or a negatively charged moiety. The carbon nanotubes 440 may be functionalized with a surrounding surfactant such that the carbon nanotubes 440 are charged.

In another embodiment, the carbon nanotube 440 selectively bonds to body metal layers 330, 311 without an additional chemical intermediate. For example, an induced charge on the carbon nanotube 440 may selectively bond to or interact with body metal layers 330, 331 and/or first oxide layer 220.

The carbon nanotubes 440 may be semiconducting nanotubes or metallic nanotubes. The dimensions of the carbon nanotubes 440 may generally vary. In some embodiments, the carbon nanotubes 440 have a width in a range from about 0.5 to about 3 nm and a length in a range from about 50 nm to about 5,000 nm.

Figure 5B:
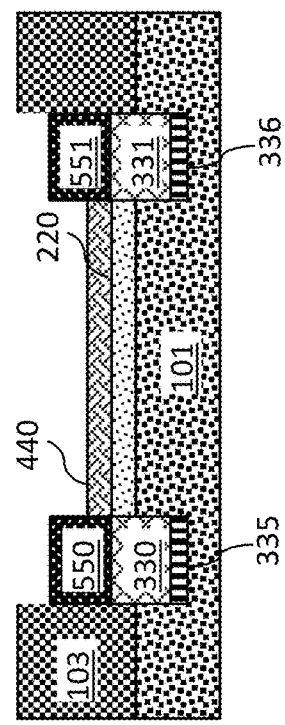
FIGS. 5A and 5B are a top view and a cross-sectional side view, respectively, after depositing body metal layers on the carbon nanotube.
Figure 5A:
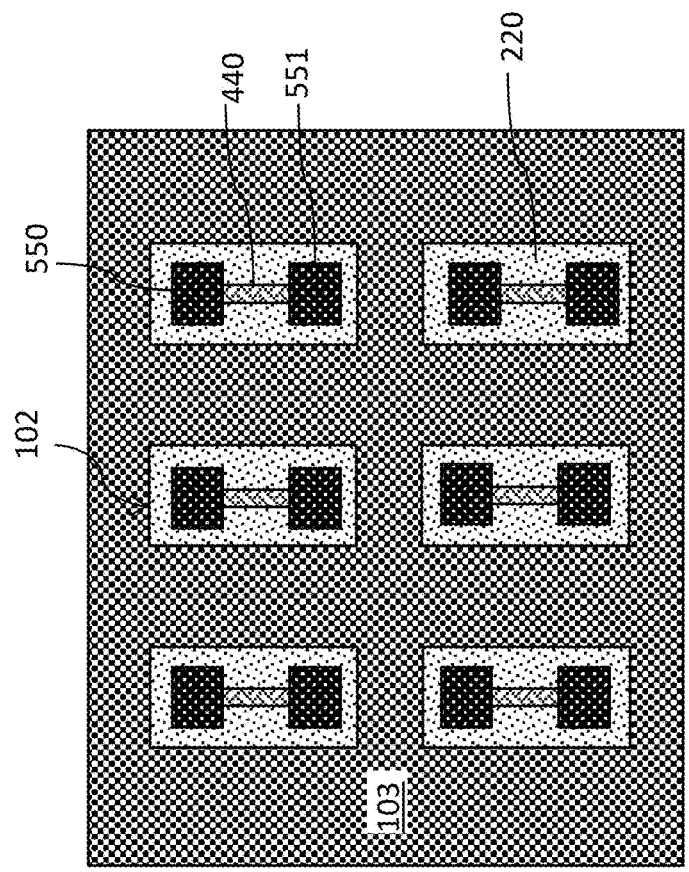

FIGS. 5A and 5B are a top view and a cross-sectional side view, respectively, after depositing body metal layers 550, 551 on the carbon nanotube 440 to form second body metal pads on the first body metal pads (body metal layers 330, 331). Photolithography methods are used to open an area above body metal layers 330, 331, and one or more metals are deposited in the patterned areas to form body metal layers 550, 551. The resulting body metal pads are arranged at ends of the carbon nanotube 440 like the first body metal pads (body metal layers 330, 331).

In one exemplary embodiment, a mask (not shown) is disposed on second oxide layer 103, body metal layers 330, 331, and carbon nanotube 440. The mask is patterned by etching to form openings in the mask above body metal layers 330, 331. Then body metal layers 550, 551 are deposited simultaneously through the openings in the mask. The same metal forms body metal layers 550, 551.

Body metal layers 550, 551 also may be formed independently using two masks. A first mask may be patterned above body metal layer 330, and body metal layer 550 is deposited. After removing the first mask, a second mask may be deposited and patterned above body metal layer 331, and body metal layer 551 is subsequently deposited. Thus different metals may be used to form body metal layers 550, 551.

Body metal layers 550, 551 may be the same or different. Body metal layers 550, 551 may be different than body metal layers 330, 331. Body metal layers 550, 551 may be the same or different than body metal layers 330, 331. Non-limiting examples of metals for body metal layers 550, 511 include aluminum (Al), platinum (Pt), gold (Au), tungsten (W), titanium (Ti), or any combination thereof. Body metal layers 550, 551 may be deposited by a suitable deposition process, for example, CVD, PECVD, PVD, plating, thermal or e-beam evaporation, sputtering, or other like processes. The thickness of body metal layers 550, 551 may generally vary. In some embodiments, body metal layers 550, 551 have a thickness in a range from about 1 to about 50 nm, or from about 5 to about 25 nm.

Figures 6A, 6B:
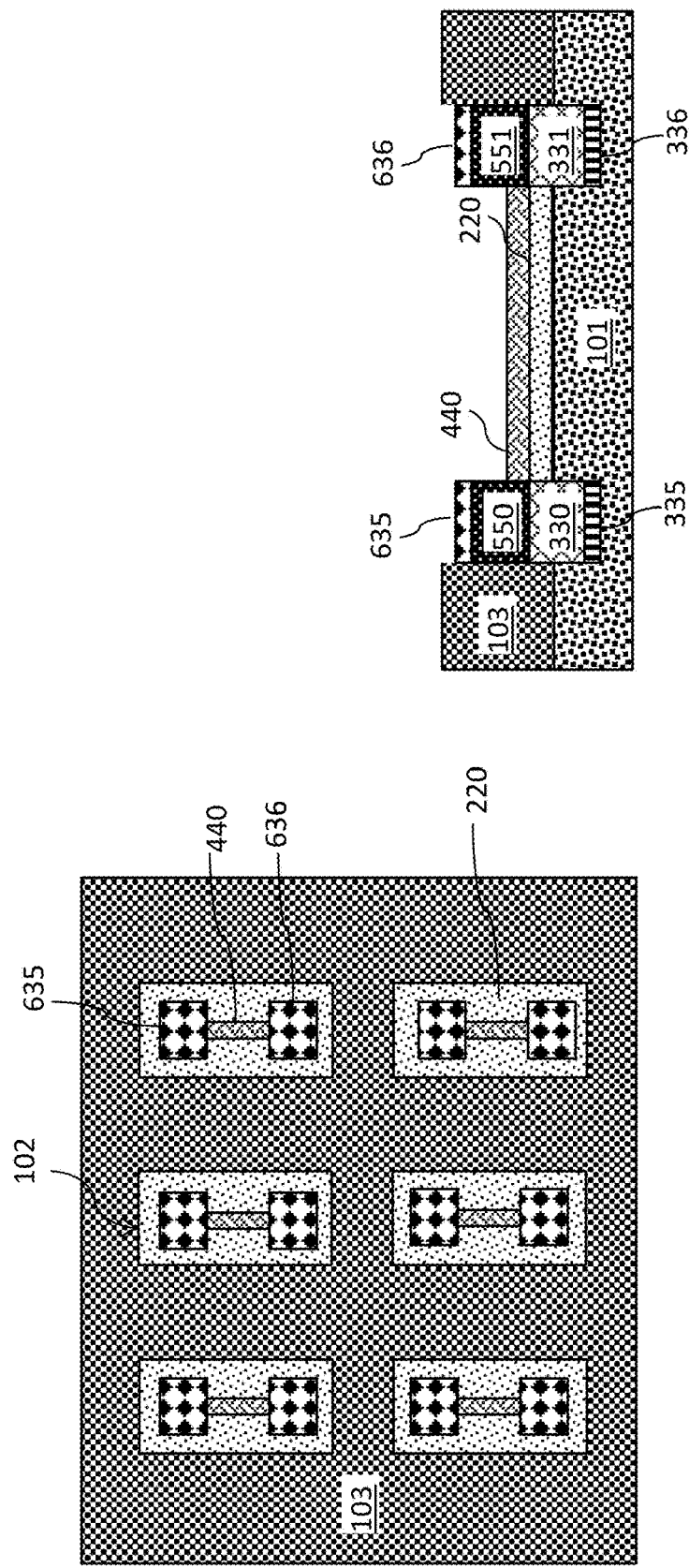
FIGS. 6A and 6B are a top view and a cross-sectional side view, respectively, after depositing face metal layers on the body metal layers.

FIGS. 6A and 6B are a top view and a cross-sectional side view, respectively, after, optionally, depositing face metal layers 635, 363 on the body metal layers 550, 551. Face metal layers 635, 636 may be deposited using the same masks used to deposit body metal layers 550, as described above. After depositing the face metal layers 635, 636, the mask is removed.

Face metal layers 635, 636 may be the same or different. Non-limiting examples of metals for face metal layers 635, 636 include aluminum (Al), platinum (Pt), gold (Au), tungsten (W), titanium (Ti), or any combination thereof. Face metal layers 636, 636 may be deposited by a suitable deposition process, for example, CVD, PECVD, PVD, plating, thermal or e-beam evaporation, sputtering, or other like processes. The thickness of face metal layers 635, 636 may generally vary. In some embodiments, face metal layers 635, 636 have a thickness in a range from about 0.5 to about 10 nm, or from about 1 to about 5 nm.

Figure 7:
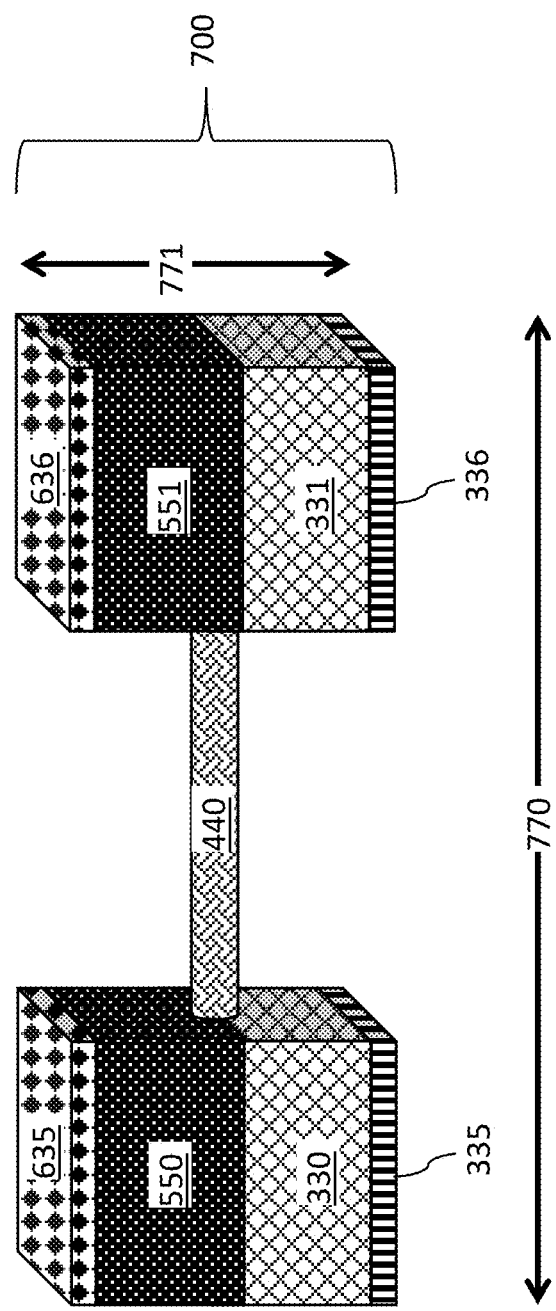

FIG. 7 is a cross-sectional side view of a carbon nanotube dumbbell structure 700 (carbon nanotube nanostructure) formed after removing the surrounding substrate 101, second oxide layer 103, and first oxide layer 220. To release the carbon nanotube dumbbell structure 700, one or more etch processes are performed.

In one example, the entire wafer is submersed in a wet etch solution. The wet etch solution may be, for example, an oxide etchant, to release the first oxide layer 220, second oxide layer 103, and substrate 101 from the carbon nanotube dumbbell structure 700. Suitable etchants include, but are not limited too, hydrofluoric acid, phosphoric acid, buffered oxide etch, or a combination thereof. The etching may take more than one exposure to different etchants.

The carbon nanotube dumbbell structure 700 is released from the supporting surfaces. The carbon nanotube dumbbell structure 700 forms the individual nanostructure units that are used to form more complex three-dimensional structures, described in FIGS. 8 and 9 below. The dimensions of the carbon nanotube dumbbell structure 700 may generally vary. In some embodiments, the length 770 is in a range from about 250 to about 5,000 nm, or from about 1,750 to about 2,250 nm. In other embodiments, the height 771 is in a range from about 50 to about 1,000 nm, or from about 250 to 750 microns.

As described below in FIGS. 8 and 9, some or all surfaces of the body metal layers 330, 331, 550, 551 and face metal layers 335, 336, 635, 636 may be functionalized. Functionalization allows for vertical stacking (see FIG. 8) and end-to-end arrangement (see FIG. 9) of the carbon nanotube structures into larger three-dimensional nanostructures.

Figure 8:
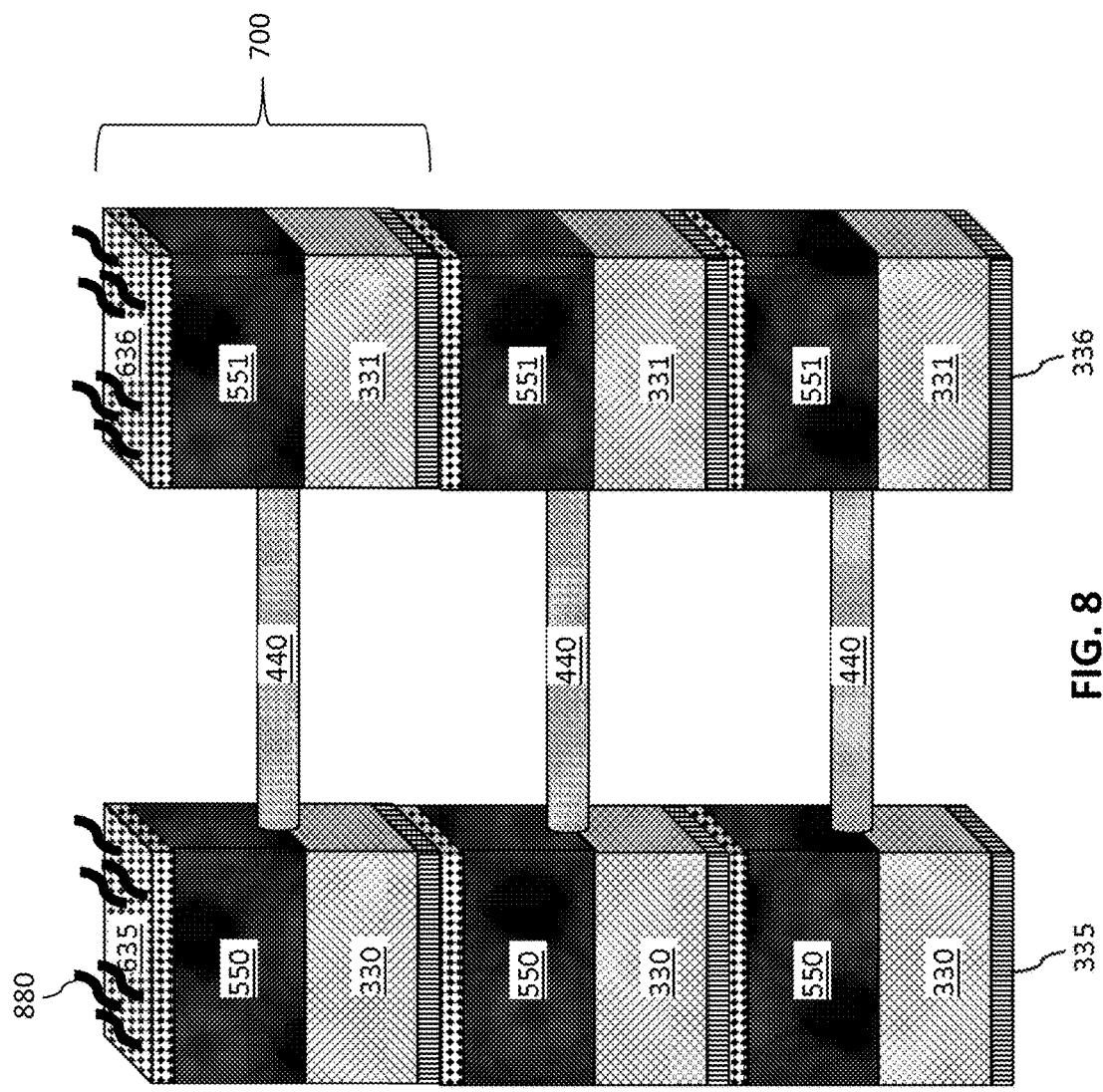

FIG. 8 is a cross-sectional side view of an assembled two-face functionalized array of carbon nanotube dumbbell structures 700. Any or all of the face metal layers 335, 336, 635, 636 may be functionalized with one or more functional groups 880 to form a ladder array. For example, face metal layers 635, 636 may be functionalized with a functional group 880 that bonds to face metal layers 335, 336. Alternatively, face metal layers 335, 336 may be functionalized (not shown) with a functional group that bonds to face metal layers 635, 636. In other embodiments, all of face metal layers 335, 336, 635, 636 may be functionalized.

In an exemplary embodiment, both face metal layers 335, 336, 635, 636 are functionalized with functional groups that promote acid-base type interactions between the carbon nanotube dumbbell structures 700. The functional group may be, for example, a thiol group, the face metal layers 335, 336, 635, 636 are gold, and the interaction forms a disulfide bond.

The functional groups used to form the ladder array may form any type of bond or interaction with the face metal layers. For example, the functional groups can promote electrostatic interactions/bonds, acid-base type interactions, or covalent bonds between the face metal layers. The functional groups may be positively charged groups, negatively charged groups, or neutral groups. The functional groups can also be highly specific biological compounds to promote specific interactions (i.e., complementary DNA, aptamers/proteins, etc.).

The resulting ladder array can be used for a variety of electrical applications. For example, the ladder array may be used in sensing applications.

Figure 9:
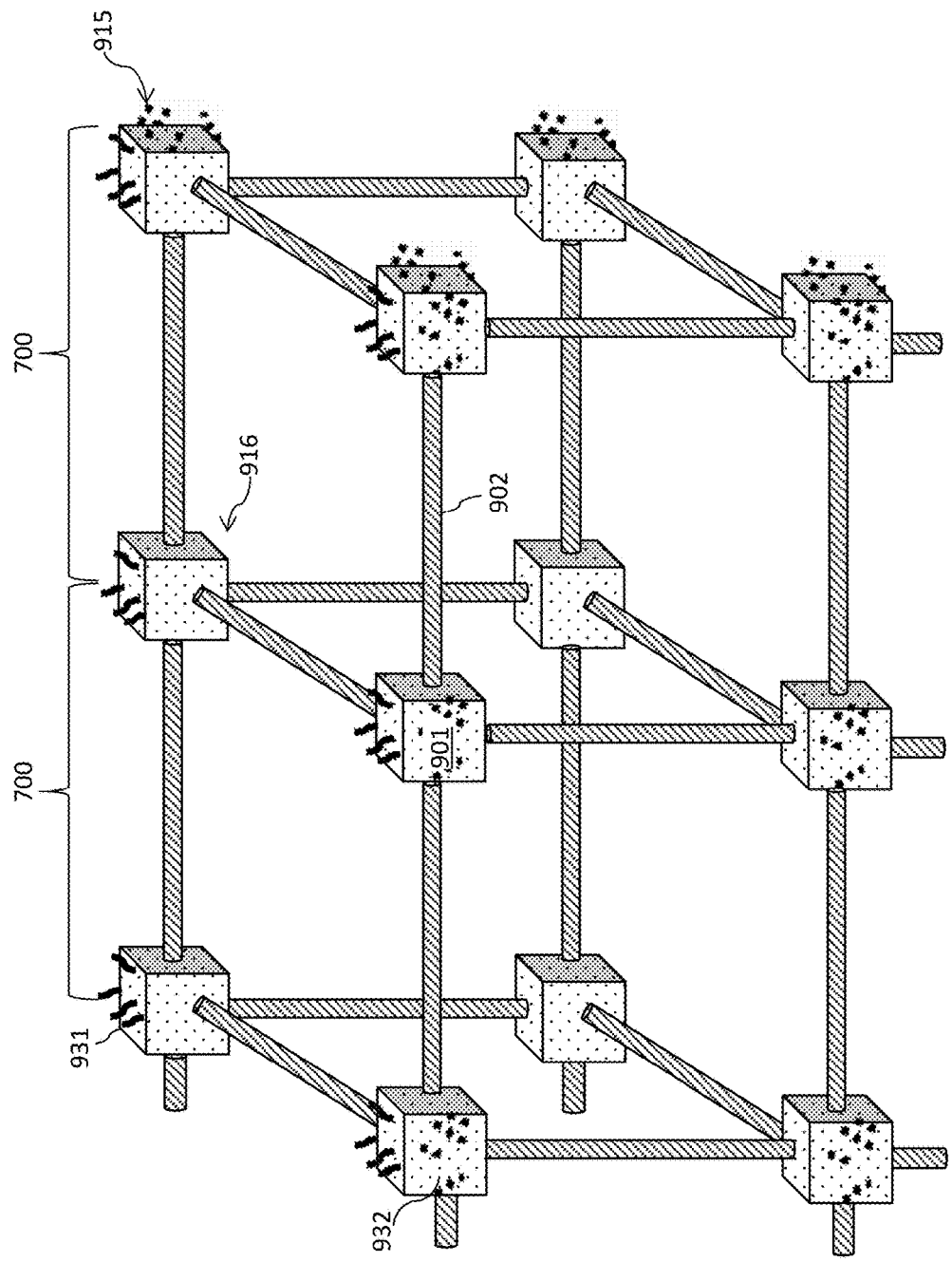

FIG. 9 is a cross-sectional side view of an assembled all-face functionalized array of carbon nanotube dumbbell structures 700. Functionalizing all faces, including the face metal layers 931 and sidewalls 932 of the body metal layers allows the nanotube dumbbell structures 700 to be assembled into a cubic geometry, which can be used to form complex wiring arrays. The functional groups arranged on the face metal layers 931 and sidewalls 932 of the body metal layers may be the same or different. When all faces are functionalized to form a cubic structure as shown in FIG. 9, each metal cube 901 forming a vertex between the carbon nanotubes 902 is formed by interaction/bonding between sidewalls 932 of functionalized body metal layers. It is noted that the schematic shown in FIG. 9 is for illustrative purposes only and is not drawn to scale, as the metal layers on ends of the cubic structure (such as end 915) will be smaller than metal layers formed at a vertex (such as vertex 916) formed by interactions between two nanotube dumbbell structures 700.

The functional groups used to form the cubic array may form any type of bond or interaction with the face metal layers and/or body metal layers. For example, the functional groups can promote electrostatic interactions/bonds, acid-base type bonds, or covalent bonds. The functional groups may be positively charged groups, negatively charged groups, or neutral groups. The functional groups can also be highly specific biological compounds to promote specific interactions (i.e., complementary DNA, aptamers/proteins, etc.).

In one exemplary embodiment, a carbon nanotube nanostructure includes a first carbon nanotube structure, comprising: a carbon nanotube having a first end and a second end; a first body metal pad arranged on the first end, the first body metal pad having a face metal layers arranged on two opposing surfaces of the first body metal pad; a second body metal pad arranged on the second end, the second body metal pad having face metal layers arranged on two opposing surfaces of the second body metal pad; and a second carbon nanotube structure, comprising: a carbon nanotube having a first end and a second end; a first body metal pad arranged on the first end, the first body metal pad having a face metal layers arranged on two opposing surfaces of the first body metal pad; a second body metal pad arranged on the second end, the second body metal pad having face metal layers arranged on two opposing surfaces of the second body metal pad; wherein a sidewall of the first body metal pad of the first carbon nanotube structure is functionalized with a chemical compound that bonds to the second carbon nanotube structure, and the first carbon nanotube structure and the second nanotube structure are arranged end-to-end. The carbon nanotube nanostructure may further include a third carbon nanotube structure arranged over and in contact with the first carbon nanotube structure, wherein the face metal layers of the first carbon nanotube structure are functionalized with a chemical compound that bonds with face metal layers of the third carbon nanotube structure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A carbon nanotube nanostructure, comprising:
   a carbon nanotube having a first end and a second end;
   a first body metal pad arranged on the first end of the carbon nanotube, the first body metal pad having a first face metal layer arranged on a first surface of the first body metal pad, and a second face metal layer arranged on a second opposing surface of the first body metal pad;
   a second body metal pad arranged on the second end of the carbon nanotube, the second body metal pad having a first face metal layer arranged on a first surface of the second body metal pad, and a second face metal layer arranged on a second opposing surface of the second body metal pad; and
   a chemical compound comprising a functional group bonded to the first face metal layer of the first body metal pad, the functional group being a thiol group.

2. The carbon nanotube nanostructure of claim 1, wherein the first body metal pad comprises a first metal layer and a second metal layer disposed on the first metal layer.

3. The carbon nanotube nanostructure of claim 2, wherein the first metal layer and the second metal layer are different.

4. The carbon nanotube nanostructure of claim 2, wherein the second body metal pad comprises a first metal layer and a second metal layer disposed on the first metal layer, and the first metal layer and the second metal layer of the second body metal pad are different.

5. The carbon nanotube structure of claim 1, wherein the first body metal pad and the second body metal pad are aluminum, platinum, gold, tungsten, titanium, or a combination thereof.

6. The carbon nanotube nanostructure of claim 1, wherein the first body metal pad and the second body metal pad are titanium.

7. The carbon nanotube nanostructure of claim 6, wherein the first and second face metal layers of the first body metal pad and the first and second face metal layers of the second body metal pad are gold.

* * * * *